(12) United States Patent  (10) Patent No.: US 7,714,686 B2
Meyer et al.  (45) Date of Patent: *May 11, 2010

(54) FREQUENCY CONVERTER WITH FAN COOLING

(75) Inventors: Matthias Meyer, Freising (DE); Christian Glanz, Dachau (DE)

(73) Assignee: Wacker Neuson SE, Munich (DE)

( * ) Notice: Subject to any disclaimer, the term of this patent is extended or adjusted under 35 U.S.C. 154(b) by 0 days.

This patent is subject to a terminal disclaimer.

(21) Appl. No.: 12/017,894

(22) Filed: Jan. 22, 2008

(65) Prior Publication Data

US 2008/0137298 A1  Jun. 12, 2008

Related U.S. Application Data

(63) Continuation of application No. 10/540,712, filed on Jun. 14, 2005, now Pat. No. 7,345,561.

(51) Int. Cl.
H01F 27/08  (2006.01)
(52) U.S. Cl. ............................................. 336/61
(58) Field of Classification Search .................. 336/61
See application file for complete search history.

(56) References Cited

U.S. PATENT DOCUMENTS 5,019,737 A  5/1991  Bruno 5,170,336 A  12/1992  Getter et al.
6,169,345 B1  1/2001  Bloch et al.
6,441,353 B1  8/2002  Gehrmann et al.

FOREIGN PATENT DOCUMENTS

DE  199 00 348 A  7/2000
EP  0 854 565 A  7/1998

*Primary Examiner*—Elvin G Enad
*Assistant Examiner*—Joselito Baisa
(74) *Attorney, Agent, or Firm*—Boyle Fredrickson, S.C.

(57) ABSTRACT

The invention relates to an air-cooled frequency converter, especially for construction site equipment, such as internal and external vibrators which are operated at a higher frequency than the existing electricity supply, said frequency converter comprising a housing and preferably being connected to a separation transformer for producing a protective extra-low voltage. The housing is divided into a converter receiving element surrounding a plate chamber, and a housing section connected to the receiving element and used as a cooling region, inside which cooling air channels and a fan for conveying the cooling air through the cooling air channels are arranged. The configuration of the housing in the cooling region are created by annular profiled elements which are cross-cut as desired, surround each other in an interspaced manner, and are coaxially arranged in relation to each other.

10 Claims, 4 Drawing Sheets

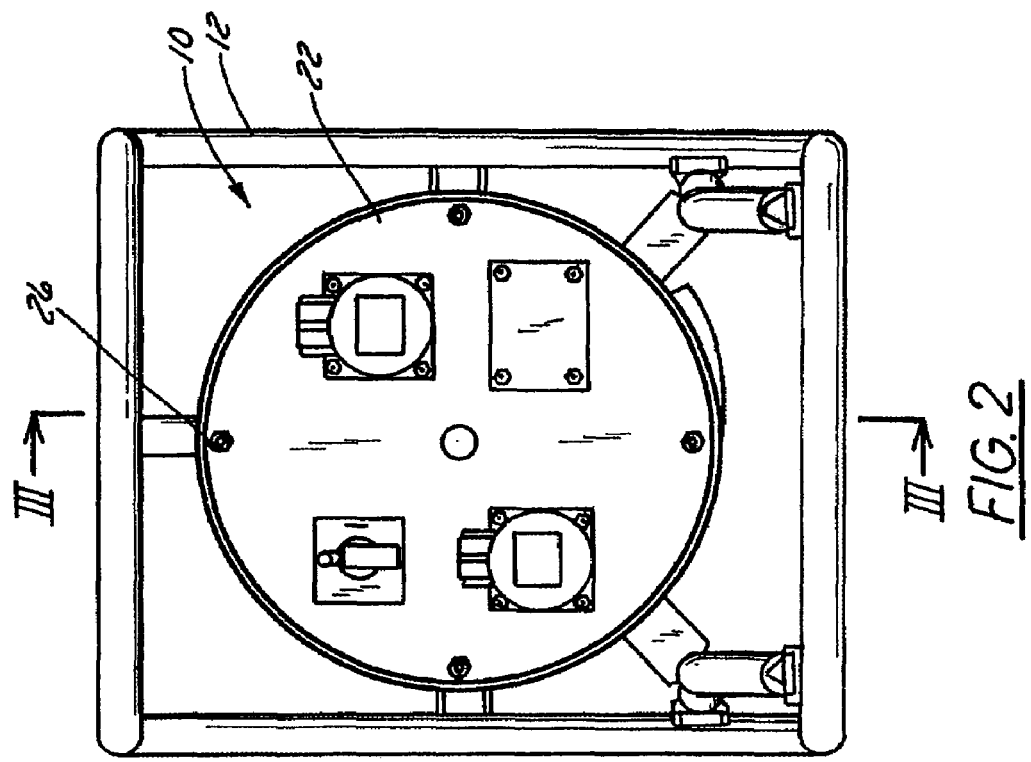
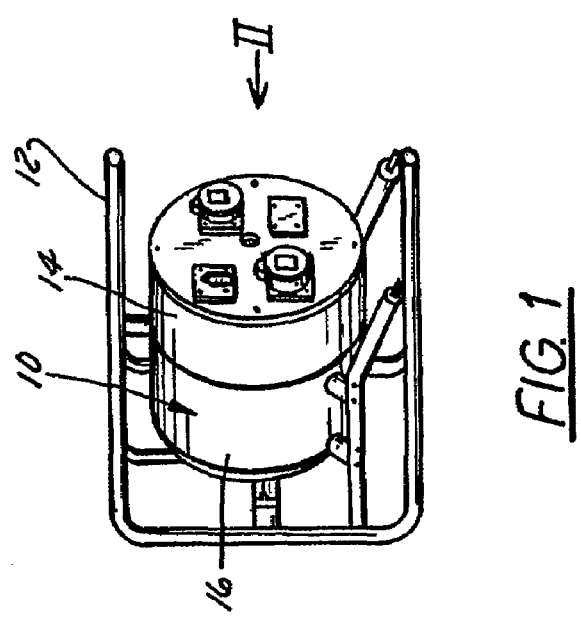

FREQUENCY CONVERTER WITH FAN COOLING

CROSS REFERENCE TO RELATED APPLICATION

This application is a continuation application of presently co-pending U.S. application Ser. No. 10/540,712, filed Jun. 14, 2005, and entitled "Frequency Converter with Fan Cooling," the entirety of which is incorporated herein by reference.

BACKGROUND OF THE INVENTION

1. Field of the Invention

The present invention relates to a frequency converter according to the preamble of Claim 1, in particular for devices used at construction sites.

2. Description of the Related Art

At construction sites, as a rule the power supplied is line current having a frequency of 50 Hz and a voltage of 230 V (sometimes also 400 V). The frequency converter to which the present invention relates converts this power available at the site into, for example, a three-phase current having a frequency of 200 Hz and a protective extra-low voltage of 42 V, the protective extra-low voltage being required in order to protect the operator from electrical risk, e.g. in a wet environment.

In known devices of this type, an isolating transformer and a converter circuit board are used that, due to their power loss, release heat that has to be dissipated. This is achieved through the use of heat sinks having a sufficiently large cooling surface, a sufficiently large housing, or overdimensioning of the isolating transformer. These heat dissipation measures are cost-intensive and result in greater weight. The known devices can have external cooling fins that can accumulate dirt and concrete over time, which has an increasingly adverse effect on the heat dissipation.

From EP-A-0 854 565, a frequency converter is known that has a converter device surrounded by a housing for converting an electrical current frequency. The housing has a converter receptacle that surrounds a board chamber for the converter device, as well as a housing segment, connected to the converter receptacle, that acts as a cooling area, inside which there are situated cooling air ducts and a fan suited for conveying cooling air through the cooling air ducts.

OBJECTS AND SUMMARY OF THE INVENTION

The object of the present invention is to design an air-cooled frequency converter of the type indicated above in such a way that the constructively determined cooling efficiency is maintained even over a longer period of use, while also enabling a smaller, more compact construction so that weight and manufacturing costs are reduced, and also such that, as a further cost-reducing measure, a predetermined basic construction can be used for devices of different power classes.

In order to achieve this object, according to the characterizing part of claim 1 the present invention is characterized in that the housing has a converter receptacle that surrounds a board chamber for the converter device, and a housing segment that is connected to the converter receptacle and that acts as a cooling area in whose interior there are situated cooling air ducts and a fan that is suitable for conveying cooling air through the cooling air ducts, and in the cooling area the housing has an external first annular or extruded profile, in relation to whose axis additional annular extruded profiles are oriented to one another in such a way that they surround each other so as to form annular chambers at a distance from one another, transverse to the axial direction, and the annular or extruded profiles situated within the first extruded profile end with an axial spacing from the converter receptacle so as to form an air deflection.

The construction according to the present invention combines the housing and the cooling system to form a compact unit in which the active air cooling by the fan or ventilator enables the reduction of the required cooling surfaces, and in which external cooling fins, which are liable to dirtying and thus to reduction of cooling efficiency, can be omitted.

In an advantageous further development of the present invention, the cooling area has a transformer chamber, adjacent to the cooling air ducts, that accommodates an isolating transformer for producing an output voltage that differs from a line voltage. In this way, the isolating transformer and the converter device can be combined to form a unit as a frequency converter, the isolating transformer being situated in the cooling area itself for optimal cooling. The isolating transformer can be used to produce a protective extra-low voltage, e.g. 42 V. Of course, it is also possible to use the isolating transformer to produce an output voltage having a higher value than the line voltage.

In a particularly advantageous construction, in the cooling area the housing has an external first annular or extruded profile, in relation to whose axis additional annular extruded profiles are oriented to one another in such a way that they surround each other so as to form annular chambers at a distance from one another, transverse to the axial direction, and the annular or extruded profiles situated within the first extruded profile end with an axial spacing from the converter receptacle so as to form an air deflection. Within the first extruded profile, and coaxial thereto, the fan is situated in the air deflection between the additional extruded profiles and the converter receptacle so as to be suitable for suctioning a cooling air stream via one of the annular chambers and expelling this stream via a different annular chamber according to the counterflow principle.

The use of extruded profiles as annular profiles enables a particularly simple, economical, and highly compact construction of the device. In a very useful development, the extruded profile adjacent to the first extruded profile can enclose an annular transformer chamber that is limited inwardly by a third extruded profile. The transformer chamber preferably contains a toroidal core transformer assembly.

According to a particularly useful specific embodiment, the extruded profiles are aluminum extruded profiles that have been cut to fit. Depending on the dimensioning of the isolating transformer, the constructive shape of the housing in the cooling area can be adapted to the space requirement of the transformer through a suitable selection of the length of the extruded profiles.

In a further very advantageous construction, the third annular or extruded profile is made up of an external and an internal ring so as to form a heat sink, cooling fins being situated in the area between the outer and the inner ring, forming one of the cooling air ducts together with the outer and inner ring.

A very simple installation is enabled in that according to a preferred feature the outer, first extruded profile engages with the adjacent extruded profile according to the tongue and groove principle.

Further advantageous and useful constructions of the present invention result from the following description of an exemplary embodiment in connection with the subclaims.

The present invention is explained in more detail on the basis of the exemplary embodiment of the present invention shown in the Figures, in the form of a frequency converter having an isolating transformer for producing a protective extra-low voltage and circulated air cooling.

BRIEF DESCRIPTION OF THE DRAWINGS

FIG. 1 shows a perspective side view of the device according to the present invention made up of a protective carriage and the device body, FIG. 2 shows a view in the direction of arrow II in FIG. 1, in a somewhat larger scale.

DETAILED DESCRIPTION OF THE PREFERRED EMBODIMENTS

A frequency converter according to the present invention has a converter device for converting the electrical current frequency from a line frequency to an electrical current having a higher frequency. In addition, as a component of the frequency converter an isolating transformer is provided with which the line voltage of for example 230 V or 400 V is transformed into a lower voltage, e.g. 42 V, so that the person working with the frequency converter or a construction device connected thereto, such as e.g. an internal vibrator for compacting concrete, will not be endangered by high electrical voltages.

As FIG. 1 shows, the device according to the present invention is made up of the actual device body 10, which contains the electrical equipment and peripheral equipment, and a frame-type protective carriage 12 that shields device body 10 on all sides and with which device body 10 is connected in releasable fashion via a plurality of connection points.

Figure 3:
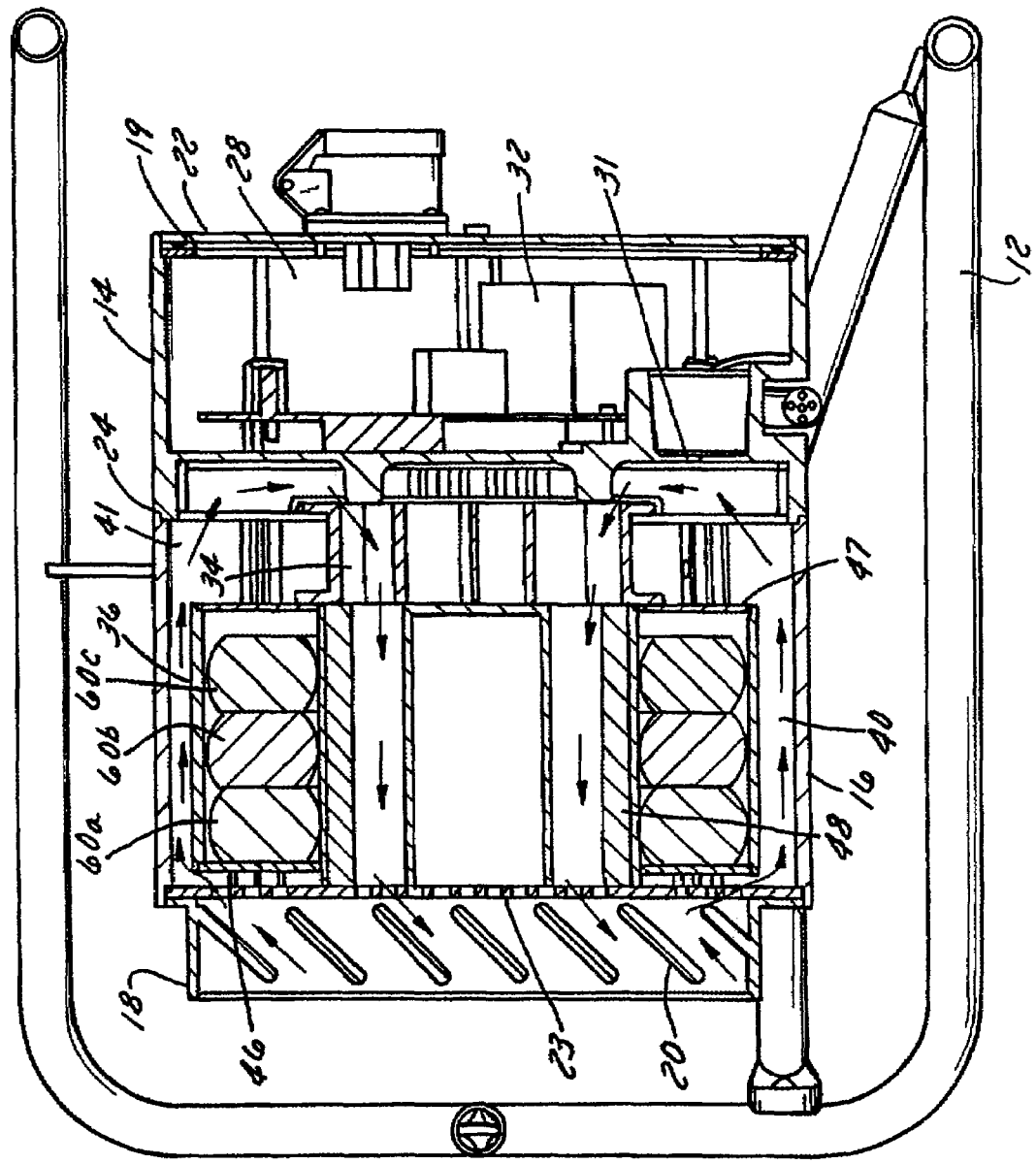
FIG. 3 shows a longitudinal section through the device along the line III-III in FIG. 2, in a further enlarged scale.
Figure 4:
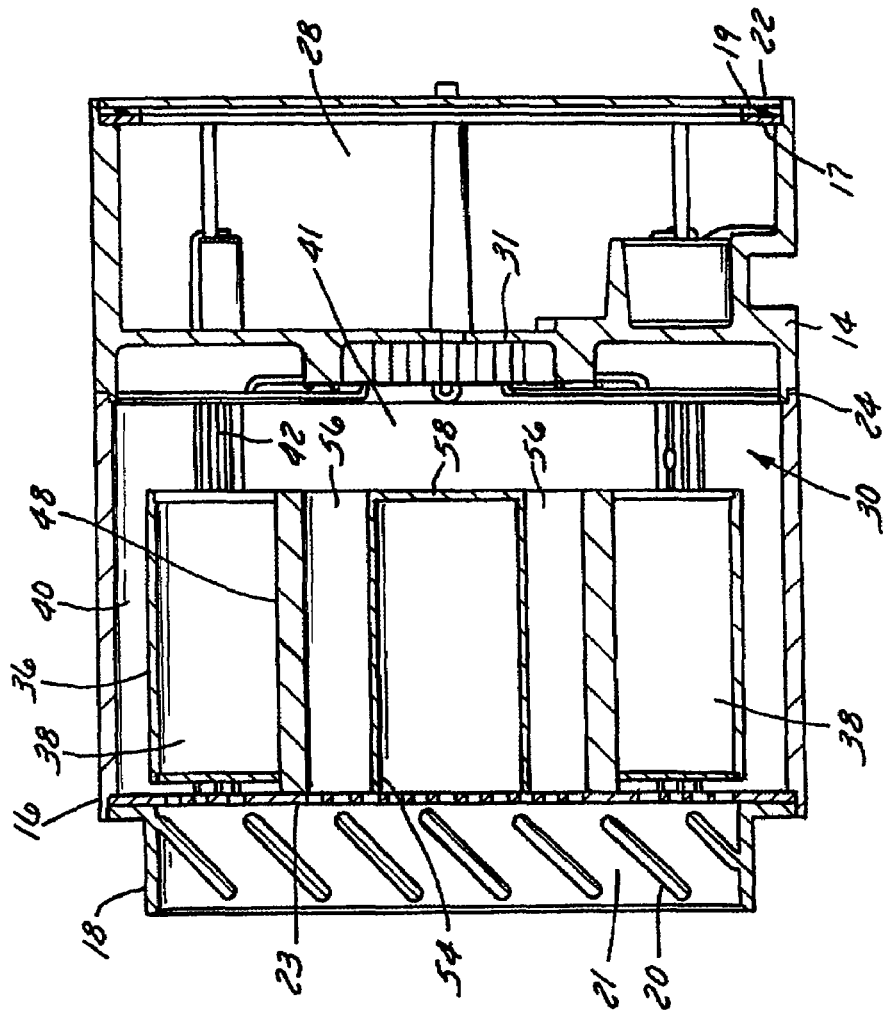
FIG. 4 shows a representation, similar to that in FIG. 3, of the installed housing of the device body without the converter board and the isolating transformer.
Figure 5:
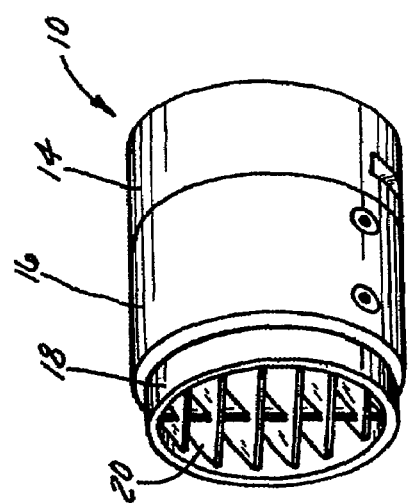
FIG. 5 shows a perspective view of the basic body.
Figure 6:
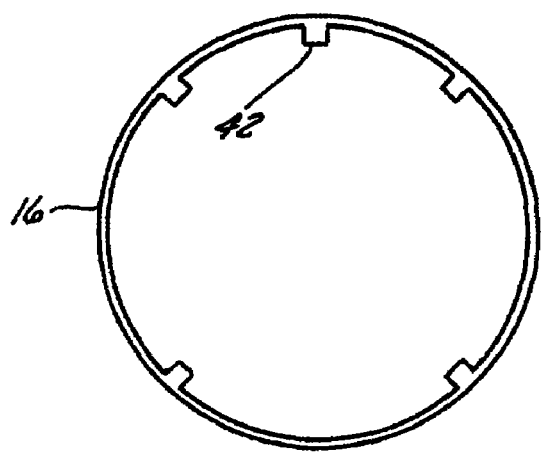
FIG. 6 shows a cross-section through the external annular profile that forms the housing segment that accommodates the transformer.
Figure 7:
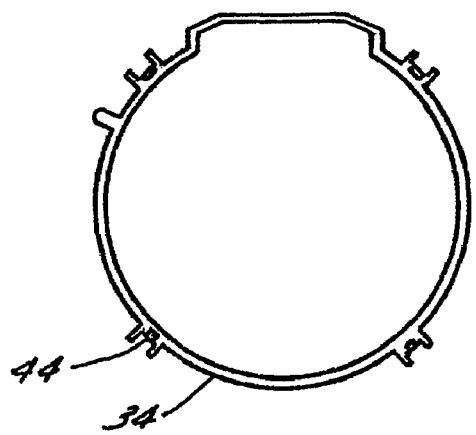
FIG. 7 shows a cross-section through the basic body profile that forms the air guide.

As is shown in FIGS. 2 to 5, device body 10 has an essentially cylindrical shape and is surrounded by a housing that is made up of a converter receptacle 14, cast from aluminum, and an external annular profile 16, which surrounds a device part used for active air cooling, which is sealed at the front side by a cover 18. Cover 18 is provided with air passage openings 21, which are protected from rain by fins 20, while converter receptacle 14 is sealed by a supporting ring 17, a seal 19, and a front plate 22, as is shown in FIG. 4. Behind cover 18, there is situated a slotted disk 23 and, if necessary, an air filter. Converter receptacle 14 and external annular profile 16 have the same outer diameter, and can be plugged into one another in the axial direction at their connection point 24 and secured in this position by suitable screw connections, as is shown in FIGS. 2 to 6.

As FIGS. 3 and 4 clearly show, board chamber 28, fashioned inside converter receptacle 14, is completely separated from the transformer and cooling area 30, which in these Figures is connected at the left and is outwardly limited by external annular profile 16 and cover 18. Board chamber 28 accommodates the electrical circuits of the converter device. Converter board 32 that is housed there, with power module, is encapsulated to form a unit and is exchangeable. A front wall or dividing wall 31, facing transformer and cooling area 30, of converter receptacle 14 is prepared for the installation of an AC-operated ventilator or fan 34 whose air routing is indicated by arrows in FIG. 3 and is described in more detail below.

Outer annular profile 16 (FIG. 6), centered with converter receptacle 14 that was manufactured e.g. by an aluminum casting method, can be connected through a tongue-and-groove design to a likewise annular basic body profile 36 that outwardly limits a transformer chamber 38. A radial distance is maintained from the inner surface of external annular profile 16, so that an air inlet duct 40 (annular duct) is formed that acts as a cooling air duct and that extends in the axial direction from cover 18 up to the area between transformer chamber 38 and board chamber 28 that acts as an air deflection 41 and that accommodates fan 34. The tongue-groove connection is made up of integrally formed tongues 42 on the inner side of external annular profile 16 and groove-type channels 44, allocated to these tongues, on the outside of basic body profile 36.

Figure 8:
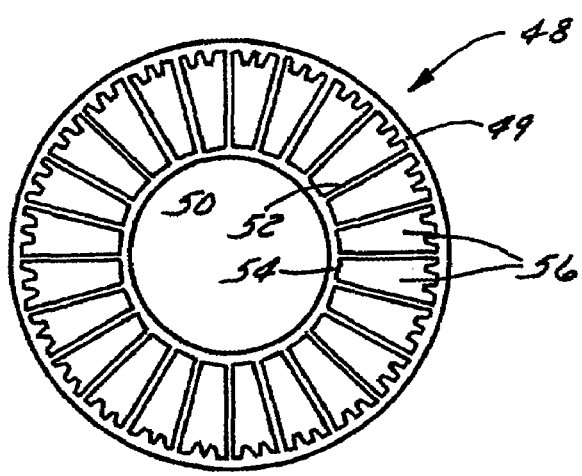
FIG. 8 shows a cross-section through the extruded profile that forms the heat sink.

In the direction towards cover 18, and in the direction towards air deflection 41, transformer chamber 38, surrounded by basic body profile 36, is closed respectively by an annular cover 46 or 47, which permit the centering of a cooler profile 48 (FIG. 8). Cooler profile 48 limits transformer chamber 38 with its external surface formed on an outer ring 49, and is provided with large-surface fins 50 and 52, some of which are large in surface, on the inside of external ring 49. Large-surface fins 52 are connected in one piece with an inner ring 54, which radially inwardly limits an air outlet duct 56 that runs from fan 34 to cover 18 with passage openings 18. Strictly speaking, air outlet duct 56 is made up of a large number of individual ducts, each of which is limited by outer ring 49 and inner ring 54 and is limited laterally by fins 52, as can be seen particularly well in FIG. 8.

The chamber enclosed by inner ring 54 is closed at its side facing fan 34 by a cover 58.

In transformer chamber 38 there is situated a transformer assembly made of three encapsulated toroidal cores 60a, 60b, and 60c. The isolating transformer having toroidal cores 60a, 60b, and 60c is thus situated completely, in annular fashion, between basic body profile 36 and cooler profile 48. Cooling air flows past the isolating transformer, thus bringing about an effective cooling, both on the radial outer side via air inlet duct 40 and also on the radial inner side via air outlet duct 56.

Because the cooling air is also directed past separating wall 31, this wall, which closes board chamber 28, is also cooled. The heat-producing devices of the converter device on converter board 32, which are fastened on the rear side of separating wall 31, thus also experience an effective cooling.

Through the use of aluminum extruded profiles, the housing of the frequency converter according to the present invention can be constructed very easily. In particular, it is easily possible, by modifying the length of the extruded profiles, to modify the length and thus the size of the housing in order to adapt it to different constructive sizes of converter devices or isolating transformers, or in order to realize different desired cooling configurations.

On the basis of the Figures, a preferred specific embodiment of the present invention has been explained in detail. Of course, within the scope of the present invention it is also possible to deviate from the concrete embodiment thus described. Thus, for example, it is unproblematically conceivable to direct the cooling air stream in the direction opposite to that shown in FIG. 3 and discussed above. Both the direction and also the course of the cooling air stream can be varied as required. Depending on the construction, this can be carried out merely by reversing the blowing direction of the fan.

In addition, it is possible to situate the fan at a different location than in the air deflection area. Thus, for example, it is conceivable to situate the fan at the end of the cooling air ducts, so that in suction operation the cooling air is drawn exclusively through the frequency converter. Conversely, the fan can also be situated upstream from the cooling air ducts of the frequency converter.

The invention claimed is:

1. A frequency converter, for construction site devices operated with an electrical current having a higher frequency than line frequency, the frequency converter comprising:
   a converter device for converting the electrical current frequency; and
   a housing that surrounds the converter device,
   the housing comprising
   a converter receptacle that surrounds a board chamber for the converter device,
   a housing segment that is connected to the converter receptacle, that is isolated from the converter receptacle that acts as a cooling area, inside which there are situated cooling air ducts and a fan that is suitable for conveying cooling air through the cooling air ducts, and
   in the cooling area, 1) an external, first annular profile, and 2) additional annular profiles are oriented to one another in relation to the axis of the first annular profile in such a way that the annular profiles surround each other with a distance from one another, transverse to a main axial direction of the housing, so as to form at least two annular chambers that act as cooling air ducts;
   wherein the annular profiles are situated inside the first annular profile end with an axial spacing from a separating wall of the converter receptacle so as to form an air deflection area that acts as a cooling air duct.

2. The frequency converter according to claim 1, wherein the converter receptacle and the cooling area are coupled with one another thermally by the separating wall.

3. The frequency converter according to claim 1, wherein the fan is situated inside the first annular profile, coaxial thereto, in such a way that it is suited to draw a cooling air stream into the fan via one of the annular chambers, to guide the cooling air stream past at least a part of the separating wall in the air deflection area, and to expel the cooling air stream via a different annular chamber according to a counterflow principle.

4. The frequency converter according to claim 1, wherein the fan is situated in the air deflection area.

5. A frequency converter for electrically powered devices operated with an electrical current having a higher operating frequency than a line frequency, the frequency converter comprising:
   a converter device that converts the electrical current frequency from the line frequency to the operating frequency; and
   a housing that surrounds the converter device, the housing comprising
   a converter receptacle that surrounds a board chamber for the converter device,
   a housing segment that is connected to the converter receptacle, that is isolated from the converter receptacle by a separating wall, and that acts as a cooling area in which a fan is located,
   an external, first annular profile that is located in the cooling area, and
   additional annular profiles that are located in the cooling area and that are oriented relative to one another in relation to an axis of the first annular profile in such a way that the additional annular profiles surround each other with a radial spacing from one another, the radial spacing extending transverse to a main axial direction of the housing so as to form at least two annular chambers that act as cooling air ducts;
   wherein the additional annular profiles are situated inside an axial end of the first annular profile with an axial spacing from the separating wall so as to form an air deflection area that acts as a cooling air duct.

6. The frequency converter according to claim 5, wherein the converter receptacle and the cooling area are thermally coupled to one another by the separating wall.

7. The frequency converter according to claim 5, wherein the fan is situated inside the first annular profile, coaxial thereto, in such a way that it is suited to draw a cooling air stream into the fan via one of the annular chambers, to guide the cooling air stream past at least a part of the separating wall in the air deflection area, and to expel the cooling air stream via a different annular chamber according to a counterflow principle.

8. The frequency converter according to claim 7, wherein the fan is situated in the air deflection area.

9. A frequency converter, for construction site devices operated with an electrical current having a higher frequency than line frequency, the frequency converter comprising:
   a converter device for converting the electrical current frequency; and
   a housing including,
   an annular transformer chamber holding a transformer therein,
   a first annular profile being positioned concentrically outside of and radially spaced from the annular transformer chamber, wherein a first annular chamber is defined by a void space provided between the first annular profile and the annular transformer, and
   a second annular profile being positioned concentrically inside of and radially spaced from the annular transformer chamber, wherein a second annular chamber is defined by a void space provided between the second annular profile and the annular transformer chamber, wherein the first and second annular profiles are fluidly connected to each other, and
   a separating wall axially spaced from at least one of the first and second annular profiles,
   wherein a cooling airflow flows through the housing by (i) entering one of the first and second annular chambers in a first direction, (ii) changing direction adjacent the separating wall, and (iii) exiting the other one of the first and second annular chambers in a second direction that opposes the first direction such that the cooling airflow passes over each of an outer circumferential surface of the transformer chamber and an inner circumferential surface of the transformer chamber.

10. The frequency converter according to claim 9, wherein the first and second annular profiles are made from an extruded aluminum material.

* * * * *